(12) United States Patent
Nakamura et al.

(10) Patent No.: US 10,677,539 B2
(45) Date of Patent: Jun. 9, 2020

(54) PLATE-TYPE HEAT TRANSPORT DEVICE

(71) Applicant: LENOVO (SINGAPORE) PTE. LTD., Singapore (SG)

(72) Inventors: Atsunobu Nakamura, Kanagawa (JP); Takuroh Kamimura, Kanagawa (JP); Akinori Uchino, Kanagawa (JP)

(73) Assignee: LENOVO (SINGAPORE) PTE LTD, Singapore (SG)

( * ) Notice: Subject to any disclaimer, the term of this patent is extended or adjusted under 35 U.S.C. 154(b) by 97 days.

(21) Appl. No.: 15/963,774

(22) Filed: Apr. 26, 2018

(65) Prior Publication Data

US 2018/0313615 A1 Nov. 1, 2018

(30) Foreign Application Priority Data

Apr. 26, 2017 (JP) ................. 2017-086834

(51) Int. Cl.
| | | |
|---|---|---|
| *F28F 3/12* | (2006.01) | |
| *H05K 7/20* | (2006.01) | |
| *H01L 23/427* | (2006.01) | |
| *H04M 1/02* | (2006.01) | |
| *F28D 15/02* | (2006.01) | |
| *G06F 1/20* | (2006.01) | |

(52) U.S. Cl.
CPC ............ *F28F 3/12* (2013.01); *F28D 15/0233* (2013.01); *G06F 1/20* (2013.01); *H01L 23/427* (2013.01); *H04M 1/026* (2013.01); *H05K 7/2099* (2013.01); *H05K 7/20336* (2013.01); *H05K 7/20972* (2013.01); *F28F 2250/102* (2013.01); *F28F 2255/00* (2013.01); *F28F 2255/08* (2013.01); *F28F 2255/16* (2013.01); *G06F 2200/201* (2013.01); *H04M 1/0202* (2013.01)

(58) Field of Classification Search
CPC ... F28F 3/12; F28F 2250/102; F28D 15/0233; H01L 23/473; H01L 23/427; H05K 7/20336; H05K 7/20972; H05K 7/2099
USPC ....................................... 165/80.4
See application file for complete search history.

(56) References Cited

U.S. PATENT DOCUMENTS

| | | | |
|---|---|---|---|
| 4,763,727 A | 8/1988 | Kreuzer et al. | |
| 4,884,168 A * | 11/1989 | August | H05K 7/20254 361/702 |
| 5,704,415 A | 1/1998 | Suzuki et al. | |
| 6,031,751 A * | 2/2000 | Janko | F28F 13/00 165/104.33 |

(Continued)

FOREIGN PATENT DOCUMENTS

| | | |
|---|---|---|
| CN | 104635889 A | 5/2015 |
| EP | 2423633 A2 | 2/2012 |

(Continued)

*Primary Examiner* — Devon Russell
(74) *Attorney, Agent, or Firm* — Antony P. Ng; Russell Ng PLLC

(57) ABSTRACT

A plate-type heat transport device is provided. The plate-type heat transport device includes a metal plate having a meandering shape flow passage. The flow passage includes multiple linear channels and return channels. The linear channels extends in parallel to each other from a first end of the metal plate to a second end of the metal plate. The return channels are located in the first and second ends of the metal plate to allow the linear channels to communicate with each other. A first area of the metal plate associated with the linear channels is thinner than a second area of the metal plate associated with the return channels. The flow passage of the metal plate contains a hydraulic fluid.

10 Claims, 8 Drawing Sheets

(56) References Cited

U.S. PATENT DOCUMENTS

| | | | | |
|---|---|---|---|---|
| 6,563,709 | B2* | 5/2003 | Negishi | F28F 3/025 165/80.4 |
| 7,204,303 | B2* | 4/2007 | Thomas | F28F 3/12 165/170 |
| 7,958,934 | B2* | 6/2011 | Nara | F28F 3/12 165/104.28 |
| 8,050,036 | B2* | 11/2011 | Suzuki | G06F 1/203 165/104.33 |
| 8,225,854 | B2* | 7/2012 | Ippoushi | H01L 23/473 165/176 |
| 2004/0006947 | A1 | 4/2004 | Shimoya | |
| 2004/0188064 | A1* | 9/2004 | Upadhya | F04B 17/00 165/80.3 |
| 2011/0232877 | A1 | 9/2011 | Meyer, IV et al. | |
| 2016/0359211 | A1* | 12/2016 | Kenney | H01M 10/6568 |

FOREIGN PATENT DOCUMENTS

| | | |
|---|---|---|
| JP | 04-366394 | 12/1992 |
| JP | 07-63487 | 3/1995 |
| JP | 08-200974 | 6/1996 |
| JP | 09-49692 | 2/1997 |
| JP | 0949692 A | 2/1997 |
| JP | 09049692 A | 2/1997 |
| JP | 2000039284 A | 2/2000 |
| JP | 2006-196766 | 7/2006 |
| JP | 2008-294128 | 12/2008 |
| JP | 2011-228508 | 11/2011 |
| JP | 2016-061538 | 4/2016 |

* cited by examiner

PLATE-TYPE HEAT TRANSPORT DEVICE

PRIORITY CLAIM

The present application claims benefit of priority under 35 U.S.C. § 120, 365 to the previously filed Japanese Patent Application No. JP2017-086834 with a priority date of Apr. 26, 2017, which is incorporated by reference herein.

TECHNICAL FIELD

The present invention relates to heat transport devices in general, and in particular to a plate-type heat transport device for electronic devices.

BACKGROUND

A heat pipe has generally been utilized to perform heat transport via phase changes of a hydraulic fluid. A conventional plate-type heat transport device provides a flow passage of a meandering shape, in which a hydraulic fluid is enclosed, inside a thin metal plate. The conventional plate-type heat transport device performs latent heat transport via the vapor generated by heat absorption of the hydraulic fluid and sensible heat transport by the vibration of the hydraulic fluid of a liquid phase.

Because the conventional plate-type heat transport device needs to form the flow passage of a meandering shape inside the metal plate, a reduction in thickness would be difficult to achieve. Therefore, when using a plate-type heat transport device in electronic devices, such as a tablet personal computer (PC), a laptop PC, or a smartphone, the plate-type heat transport device can become a factor of inhibiting the thickness reduction of chassis of the electronic devices. On the other hand, the heat generation amount in those electronic devices has been increased due to an increased in processing load and an improvement of the arithmetic capability.

Consequently, it would be preferable to provide an improved plate-type heat transport device.

SUMMARY

In accordance with an embodiment of the present disclosure, a plate-type heat transport device includes a metal plate having a meandering shape flow passage. The flow passage includes multiple linear channels and return channels. The linear channels extends in parallel to each other from a first end of the metal plate to a second end of the metal plate. The return channels are located in the first and second ends of the metal plate to allow the linear channels to communicate with each other. A first area of the metal plate associated with the linear channels is thinner than a second area of the metal plate is associated with the return channels. The flow passage of the metal plate contains a hydraulic fluid.

All features and advantages of the present disclosure will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION

Figure 1:
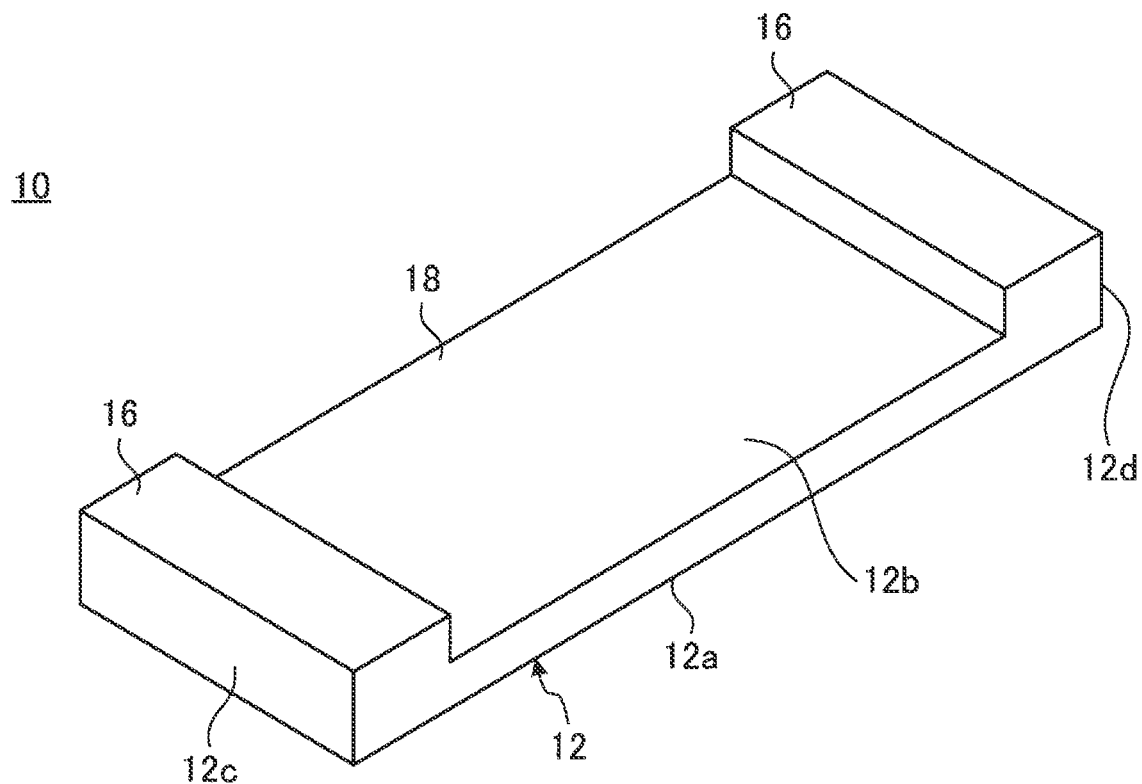
FIG. 1 is a perspective view of a plate-type heat transport device, according to one embodiment.
Figure 2A:
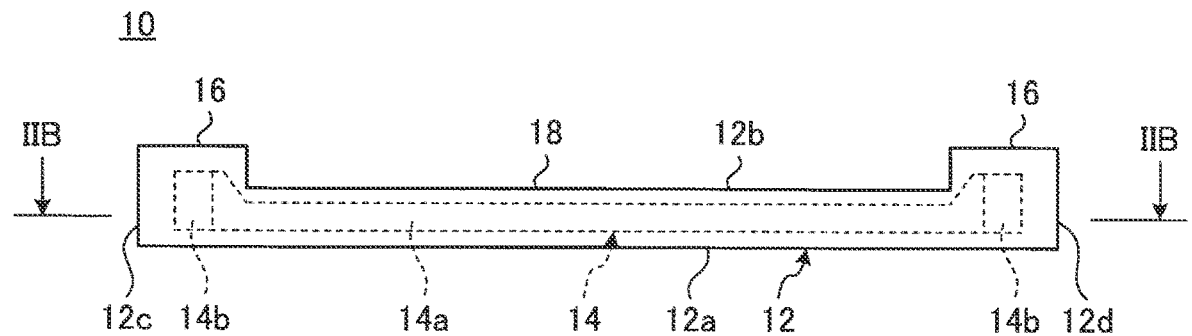
FIG. 2A is a side view of the heat transport device from FIG. 1.
Figure 2B:
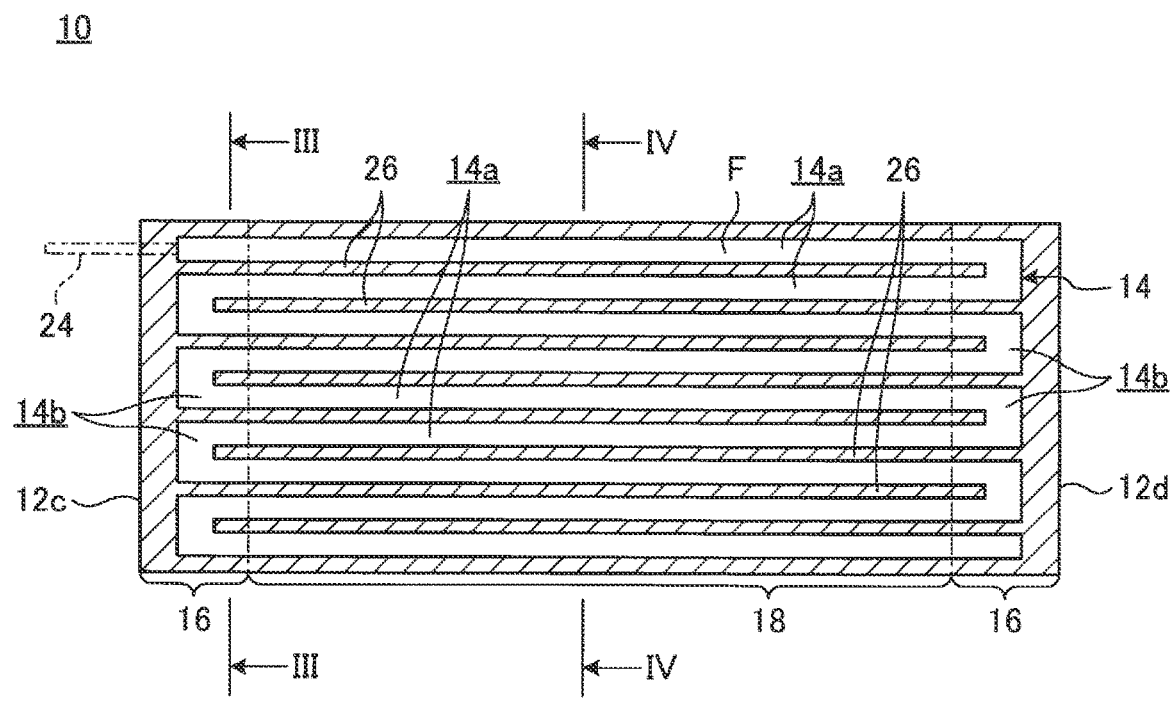
FIG. 2B is a cross-sectional view along the IIB-IIB line in FIG. 2A.

FIG. 1 is a perspective view of a plate-type heat transport device 10, according to one embodiment. FIG. 2A is a side view of the heat transport device 10 from FIG. 1. FIG. 2B is a cross-sectional view along the IIB-IIB line in FIG. 2A. As illustrated in FIG. 1 to FIG. 2B, the heat transport device 10 has a metal plate 12 and has a flow passage 14, in which a hydraulic fluid F is enclosed, inside the metal plate 12.

The metal plate 12 is a plate formed by metal with high thermal conductivity, such as aluminum or copper. The metal plate 12 has thick portions 16 in both end portions in the longitudinal direction and has a thin portion 18 between the thick portions 16 and 16.

The thick portions 16 are portions in which the plate thickness of a raw material plate 20 (refer to FIG. 9A) which is an intermediate before forming the metal plate 12 is left. The thick portion 16 has a plate thickness of about 2 mm, for example. The thin portion 18 is a portion configured with a plate thickness smaller than that of the thick portion 16. The thin portion 18 has a plate thickness of about 1.3 mm, for example. The thin portion 16 is formed by crushing the metal plate 12 via pressing, and the details will be provided below.

The heat transport device 10 of the present disclosure is mounted in a portable electronic device 22 (refer to FIG. 5), such as a tablet type PC, described later, and therefore the thick portions 16 and the thin portion 18 are configured with the plate thickness mentioned above. The plate thickness of the thick portions 16 and the thin portion 18 can be varied as appropriate.

In the heat transport device 10 of the present disclosure, while one surface 12a side of the metal plate 12 is configured so as to have a flat plate shape, the other side surface 12b side is partially recessed in the plate thickness direction over the entire width direction (lateral direction in FIG. 1), whereby the thin portion 18 is formed. Thus, the heat transport device 10 (metal plate 12) is configured so as to have a recessed shape or a flat U shape as viewed in side view illustrated in FIG. 2A. The heat transport device 10 may be configured so that the width dimension of the thin portion 18 is smaller than the width dimension of the metal plate 12, and thus may be configured so as to have a vessel shape.

The flow passage 14 is a meandering flow passage in which a tunnel-like fine hole is caused to meander inside the metal plate 12. The flow passage 14 has a plurality of linear portions (linear flow passage) 14a and a plurality of returns portion (return flow passage) 14b.

The linear portions 14a are fine holes extending from one end portion 12c toward the other end portion 12d in the longitudinal direction of the metal plate 12. Two or more (9 in FIG. 2B) of the linear portions 14a are arranged in parallel to each other along a direction orthogonal to the direction from the one end portion 12c toward the other end portion 12d, i.e., the width direction of the metal plate 12.

The return portions 14b are fine holes of a substantially U shape causing end portions of the linear portions 14a and 14a adjacent to each other to communicate with each other. The return portion 14b cause the end portions of the two linear portions 14a and 14a adjacent to each other to communicate with each other and does not cause the end portions of the three or more linear portions 14a to communicate with each other at once. Therefore, as illustrated in FIG. 2B, both the end portions of all the linear portions 14a are sequentially caused to communicate with the adjacent linear portion 14a, so that the flow passage 14 is formed as one meandering fine hole.

Both end portions of the flow passage 14 are closed, so that the hydraulic fluid F is enclosed therein. As the hydraulic fluid F, alternative chlorofluorocarbon, chlorofluocarbon, acetone, butane, or the like is used. In the present disclosure, alternative chlorofluorocarbon is used for the hydraulic fluid F. As illustrated by the chain double-dashed line in FIG. 2B, a fine tube 24 serving as an entrance port of the hydraulic fluid F communicates with one end portion of the flow passage 14. The fine tube 24 is closed after the charge of the hydraulic fluid F into the flow passage 14 is completed.

As illustrated in FIG. 2A and FIG. 2B, the return portions 14b are disposed at positions corresponding to the thick portions 16 and the linear portions 14a are disposed at a position corresponding to the thin portion 18 and partially disposed at portions corresponding to the thick portions 16. In other words, in the metal plate 12, the plate thickness of at least one, part of plate thickness of the portion corresponding, to the linear portions 14a is formed to be smaller than the plate thickness of the portions corresponding to the return portions 14b, and the portion having the small plate thickness serves as the thin portion 18. It is desirable that the thin portion 18 is not provided at the positions corresponding to the return portions 14b and provided within the range of the linear portions 14a.

Figure 3:
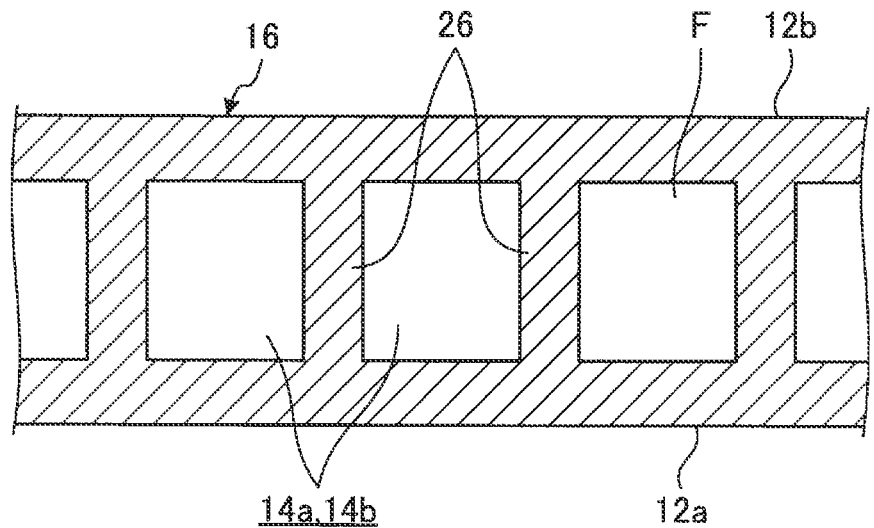
FIG. 3 is a cross-sectional view along the line III-III in FIG. 2B.
Figure 4:
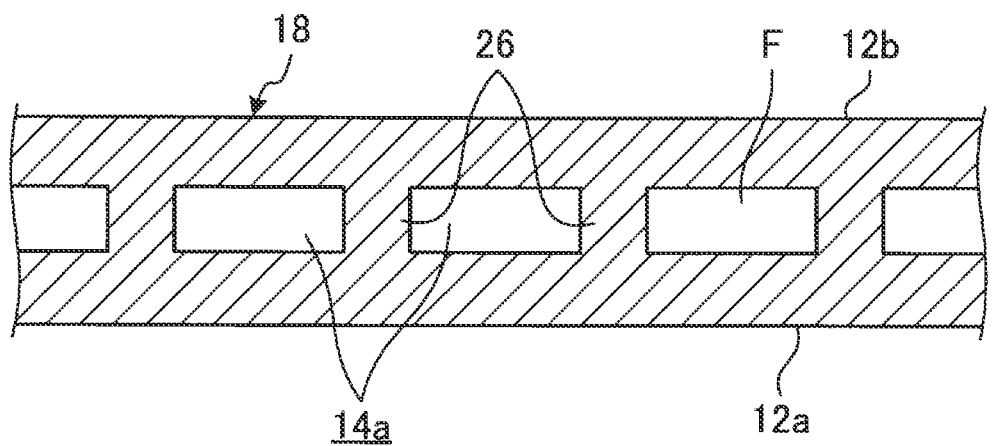
FIG. 4 is a cross-sectional view along the IV-IV line in FIG. 2B.

FIG. 3 is a cross-sectional view along the III-III line in FIG. 2B. FIG. 4 is a cross-sectional view along the IV-IV line in FIG. 2B.

In the flow passage 14, the cross-sectional area of the position (refer to FIG. 3) corresponding to the thick portion 16 is larger than the cross-sectional area of the position (refer to FIG. 4) corresponding to the thin portion 18. In the flow passage 14, the return portions 14b having a high pressure loss are provided at the positions corresponding to the thick portions 16 and have a large cross-sectional area. Thus, the flow passage 14 can prevent a reduction in the heat transport performance by the hydraulic fluid F due to the pressure loss in the return portions 14b. On the other hand, the linear portions 14a have a pressure loss lower than that of the return portions 14b. Therefore, even when the linear portions 14a are crushed by the thin portion 18 so as to have a small cross-sectional area, the heat transport performance by the hydraulic fluid F is hardly influenced.

As described above, the thin portion 18 of the present disclosure is formed by crushing the metal plate 12 by pressing. Therefore, wall portions 26 partitioning the linear portions 14a adjacent to each other are not provided along the plate thickness direction of the metal plate 12 as illustrated in FIG. 4 but provided to be tilted from the plate thickness direction to some extent, so that there is a high possibility that the flow passage cross section of the linear portions 14a have a shape close to a parallelogram.

In such a heat transport device 10, a heating element is disposed abutting on the outer surface of the metal plate 12 at the position corresponding to the linear portions 14a or the return portions 14b on the other end portion 12d side, for example. Thus, the heat transport device 10 absorbs the heat from the heating element, transports the heat to the one end portion 12c side through the hydraulic fluid F, and dissipates the heat to the outside from the outer surface of the metal plate 12 at or around the position corresponding to the return portions 14b on the one end portion 12c side. As a result, the heat transport device 10 can cool the heating element. The heat transport device 10 is a heat lane (plate-type heat pipe) capable of generating high heat transport capability by causing latent heat transport by the vapor evaporated from the hydraulic fluid F enclosed in the flow passage 14 by the heat absorption from the heating element and sensible heat transport by the vibration of the hydraulic fluid F of a liquid phase.

Figure 5:
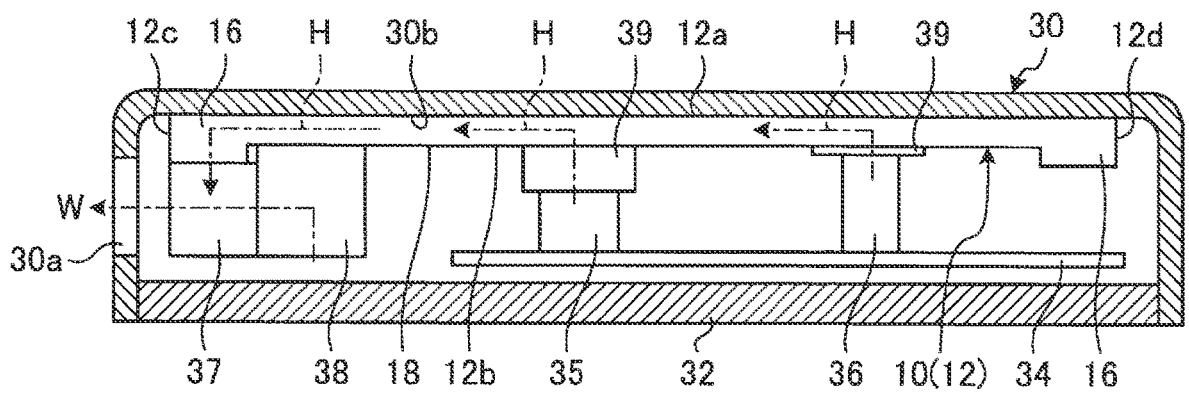
FIG. 5 is a cross-sectional view of the internal structure of an electronic device carrying the heat transport device from FIG. 1.

FIG. 5 is a cross-sectional view of the internal structure of the electronic device 22 carrying the heat transport device 10 illustrated in FIG. 1.

As shown in FIG. 5, the electronic device 22 has a configuration of having a display 32 on the opening surface of a chassis 30 which is a flat thin vessel. As the electronic device 22, a tablet type PC is mentioned as an example but a smartphone, a Laptop PC and the like may be acceptable. The chassis 30 is formed of metals, such as aluminum or magnesium, for example. The display 32 is a touch panel type liquid crystal display, for example.

The electronic device 22 has the heat transport device 10, a substrate 34, a CPU 35, a DC-DC converter 36, a heat dissipation fin 37, and an air blowing fan 38 inside the chassis 30.

The CPU 35 is a central processing unit and is accompanied by the maximum heat generation among electronic components to be mounted in the electronic device 22. The DC-DC converter 36 converts a direct-current voltage and is configured so that the physical height dimension is larger than that of the CPU 35 and is accompanied by large heat generation. The CPU 35 and the DC-DC converter 36 each are disposed abutting on the outer surface of the thin portion 18 of the heat transport device 10 through a thermal rubber sheet 39 having high thermal conductivity. Inside the chassis 30, various kinds of electronic components, such as a memory which is not illustrated, are further stored.

The heat dissipation fin 37 is formed of metal with high thermal conductivity, such as aluminum or copper. The heat dissipation fin 37 is disposed abutting on the outer surface of the thick portion 16 on the one end portion 12c side of the heat transport device 10, for example. The heat dissipation fin 37 may be disposed abutting on the outer surface of the thick portion 16 on the other end portion 12d side or the outer surface of the thin portion 18. The air blowing fan 38 sucks the air in the chassis 30, and then blows the air toward the heat dissipation fin 37. Cooling air W passing through the heat dissipation fin 37 from the air blowing fan 38 is emitted to the outside through an exhaust port 30a formed in the side wall of the chassis 30.

In the heat transport device 10, the flat plate-like one surface 12a is disposed facing one inner surface 30b of the chassis 30 or the one surface 12a is disposed abutting on the one inner surface 30b. Therefore, in the electronic device 22, heat H generated in the heating elements, such as the CPU 35 and the DC-DC converter 36, is transported to the one end portion 12c side with high efficiency by the hydraulic fluid F enclosed in the flow passage 14 of the heat transport device 10. The transported heat H is transmitted to the heat dissipation fin 37, and then discharged from the exhaust port 30a to the outside of the chassis 30 by the cooling air W from the air blowing fan 38. The heat H is partially emitted to the outside from the one surface 12a through the one inner surface 30b. At this time, in the electronic device 22, the heating elements, such as the CPU 35 and the DC-DC converter 36, can be disposed at positions corresponding to the thin portion 18 of the heat transport device 10. Therefore, the heat transport device 10 can prevent the inhibition of the thickness reduction of the chassis 30 of the electronic device 22.

Figure 6:
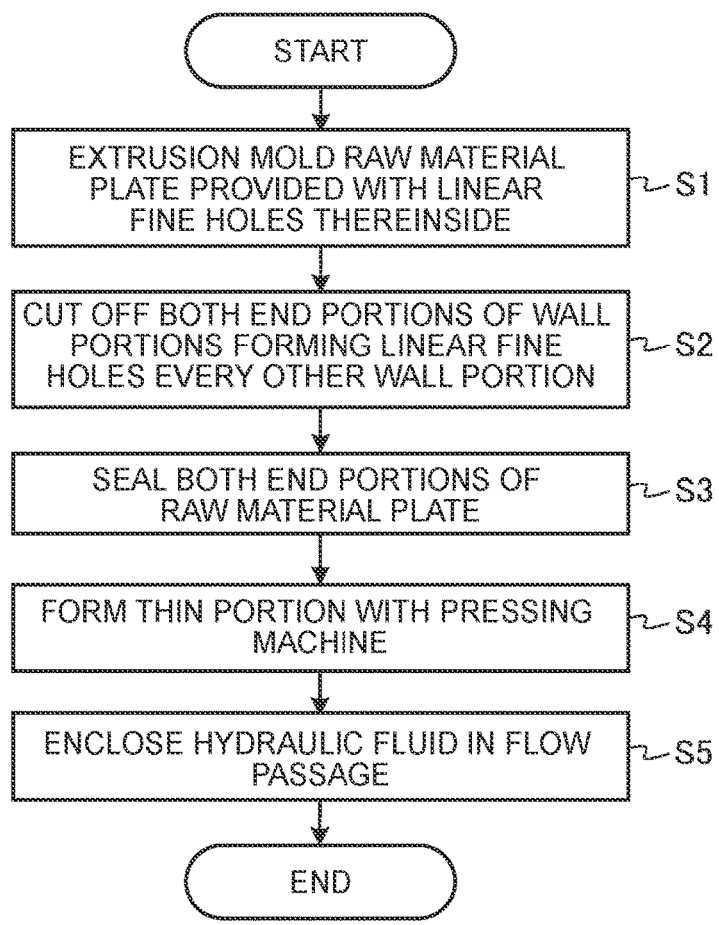
FIG. 6 is a flow chart of a method for manufacturing a plate-type heat transport device, according to one embodiment.
Figure 7:
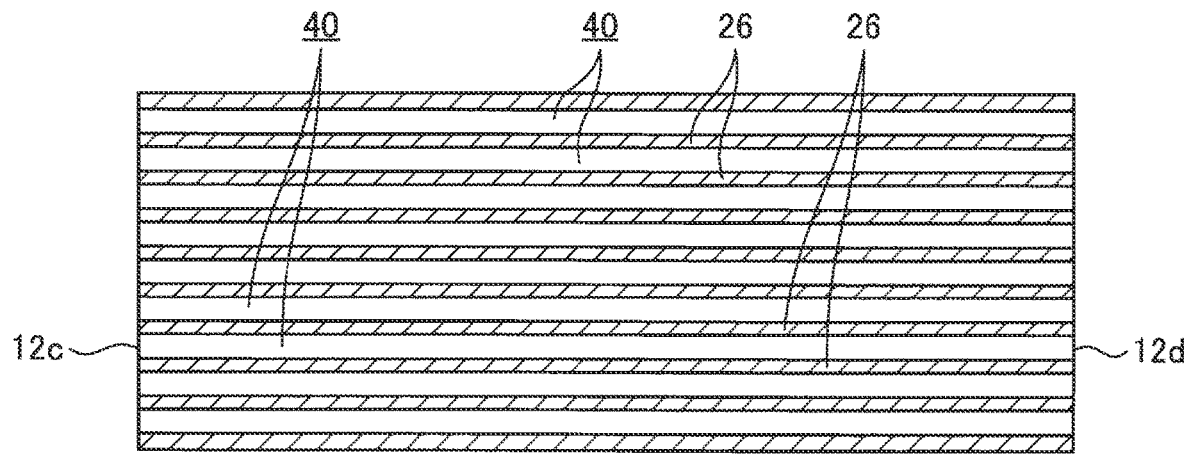
FIG. 7 is a top cross-sectional view of the configuration of a raw material plate.
Figure 8:
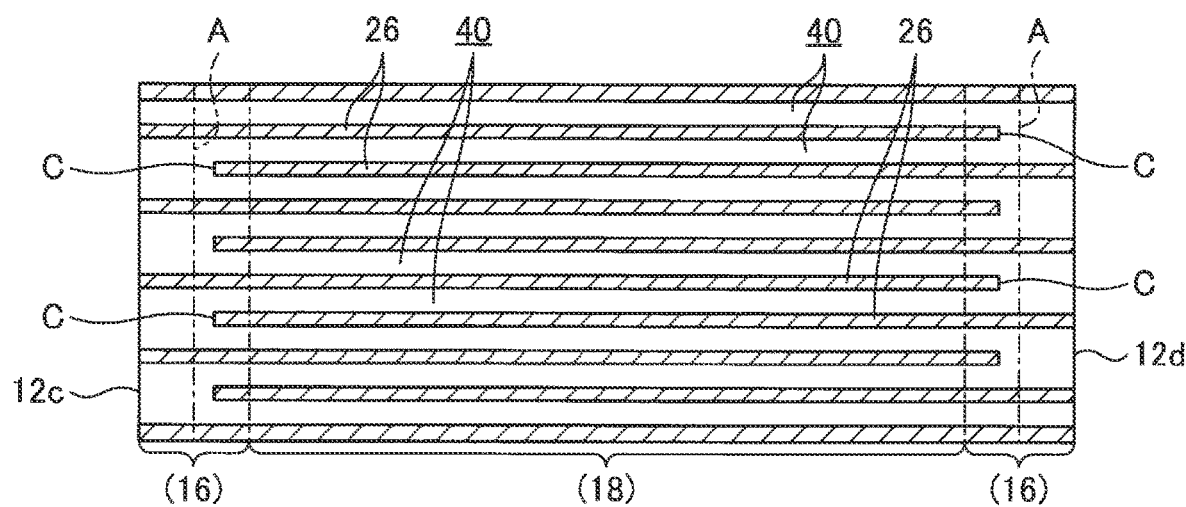
FIG. 8 is a top cross-sectional view of a state where some wall portions of both end portions of the raw material plate from FIG. 7 are cut off.

Next, an example of a method for manufacturing the heat transport device 10 is described. FIG. 6 is a flow chart of a method for manufacturing the plate-type heat transport device 10, according to one embodiment. FIG. 7 is a top cross-sectional view of the raw material plate 20. FIG. 8 is a top cross-sectional view illustrating a state where some wall portions 26 of both the end portions of the raw material plate 20 illustrated in FIG. 7 are cut off.

First, in Step S1 in FIG. 6, the raw material plate 20 serving as an intermediate before the molding of the metal plate 12 is formed by extrusion molding. As illustrated in FIG. 7, the molded raw material plate 20 has the same number (9 in FIG. 7) of the linear fine holes 40 partitioned from each other by the wall portions 26 as the number of the linear portions 40 of the metal plate 12 illustrated in FIG. 2B. More specifically, the raw material plate 20 is a plate in which the linear fine holes 40 penetrating in the longitudinal direction thereof are arranged in parallel to each other in the width direction.

In Step S2, both end portions of the wall portions 26 forming the linear fine holes 40 of the raw material plate 20 are cut off every other wall portion as illustrated in FIG. 8. Removal portions C of the wall portions 26 are set to be alternately arranged on the one end portion 12c side and the other end portion 12d side. At this time the removal portions C are provided within a range where the removal portions C are placed in portions finally serving as the thick portions 16 of the metal plate 12.

In Step S3, both the end portions 12c and 12d of the raw material plate 20 are sealed to form the flow passage 14. More specifically, with respect to both the end portions 12c and 12d of the raw material plate 20, positions where portions serving as the return portions 14b of the flow passage 14 after sealing can be secured, for example, portions located outside relative to the positions illustrated by the alternate long and short dash lines A in FIG. 8, are crushed in the plate thickness direction to be sealed. Thus, the raw material plate 20 is formed into a flat plate having the same flow passage 14 as the flow passage 14 illustrated in FIG. 2B.

In Step S4, the raw material plate 20 in which the flow passage 14 is formed is molded with a pressing machine 42, so that the thin portion 18 is formed.

Figure 9A:
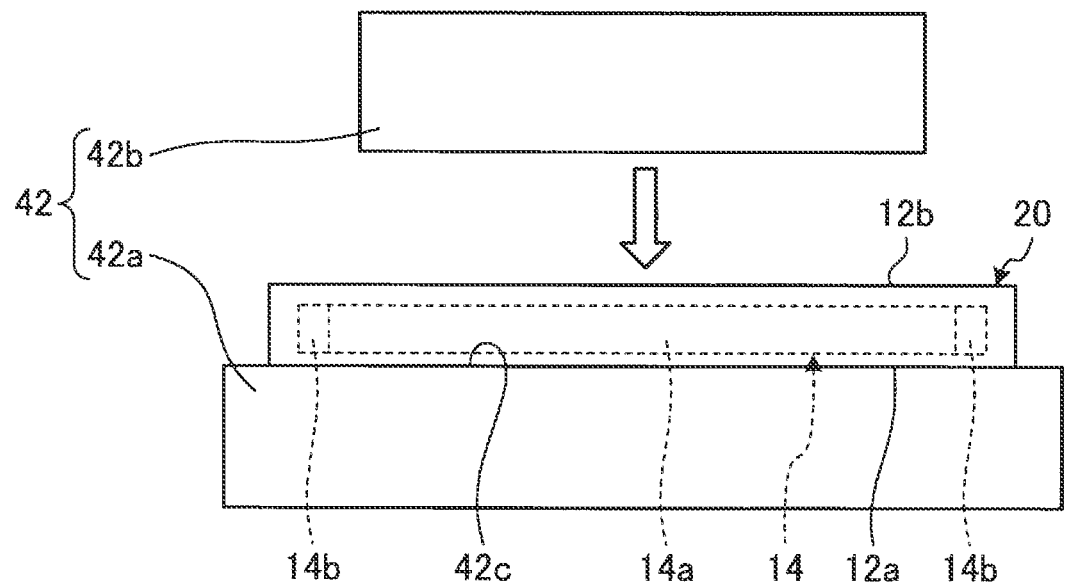
FIG. 9A is a side view of a state where the raw material plate is set in a pressing machine.
Figure 9B:
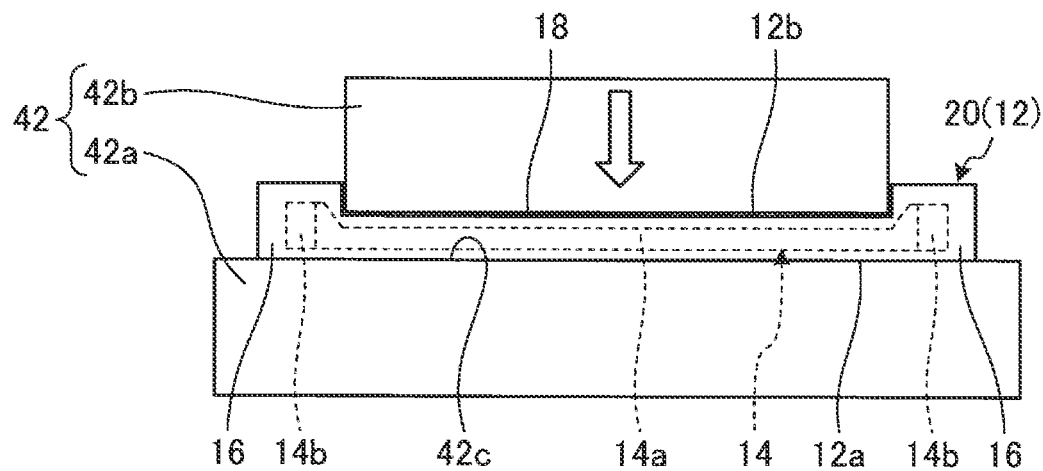
FIG. 9B is a side view of a state where the raw material plate is press molded from the state illustrated in FIG. 9A to form a metal plate.

FIG. 9A is a side view illustrating a state where the raw material plate 20 is set in the pressing machine 42. FIG. 9B is a side view illustrating a state where the raw material plate 20 is press molded from the state illustrated in FIG. 9A to form the metal plate 12.

As illustrated in FIG. 9A, when the raw material plate 20 is pressed, the raw material plate 20 is first placed on a surface 42c of a lower die 42a of the pressing machine 42. The surface 42c of the lower die 42a is configured so as to have a flat plate shape on which the entire surface of the raw material plate 20 can be placed. At this time, the raw material plate 20 is disposed so that the one surface 12a abuts on the surface 42c of the lower die 42a.

Then, as illustrated in FIG. 9B, an upper die 42b of the pressing machine 42 is lowered to crush the raw material plate 20 between the upper die 42b and the lower die 42a. The upper die 42b has a shape such that, while only the position corresponding to the linear portions 14a of the flow passage 14 formed in the raw material plate 20 can be crushed, the position corresponding to the return portions 14b is avoided. Thus, the raw material plate 20 is formed into the metal plate 12 provided with the thin portion 18 between the thick portions 16 and 16.

Finally, the hydraulic fluid F is charged into the flow passage 14 of the metal plate 12 in Step S5 to thereby complete the manufacturing of the heat transport device 10.

Figure 10:
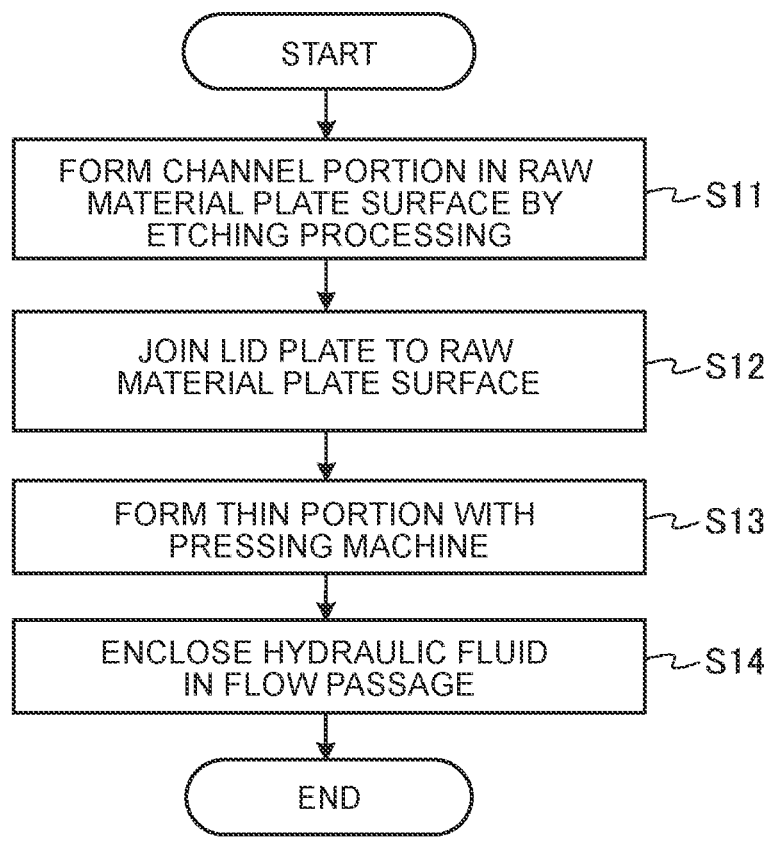
FIG. 10 is a flow chart of a method for manufacturing a plate-type heat transport device, according to an alternative embodiment.

Next, a modification example of the method for manufacturing the heat transport device 10 is described. FIG. 10 is a flow chart illustrating another procedure of the method for manufacturing the plate-type heat transport device 10.

According to the manufacturing method illustrated in FIG. 6 described above, the raw material plate 20 in a stage before the molding of the metal plate 12 is formed by extrusion molding. On the other hand, according to the manufacturing method illustrated in FIG. 10, a raw material plate 50 in a stage before the molding of the metal plate 12 is formed by etching processing.

More specifically, in Steps S11 and S12 in FIG. 10, the raw material plate 50 serving as an intermediate before the molding of the metal plate 12 is formed utilizing etching processing.

Figure 11:
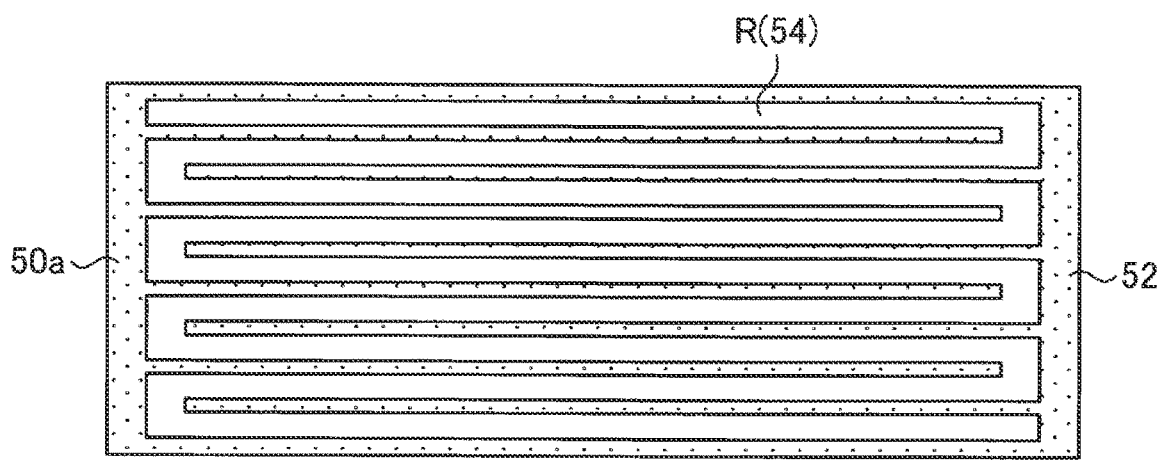
FIG. 11 is a top view of a state where the surface of the raw material plate is masked.

First, in Step S11, a mask 52 is provided on a surface 50a of the raw material plate 50 of a flat plate shape as illustrated in FIG. 11. The mask 52 is a shaded portion in FIG. 11. The mask 52 is a masking seal or a masking paint covering a portion which is not subjected to etching processing of the raw material plate 50. Therefore, the mask 52 is provided in portions other than the course of the flow passage 14 illustrated in FIG. 2B. In other words, the mask 52 is not provided in a non-mask region R which is a portion serving as the flow passage 14 in the final metal plate 12.

Figure 12:
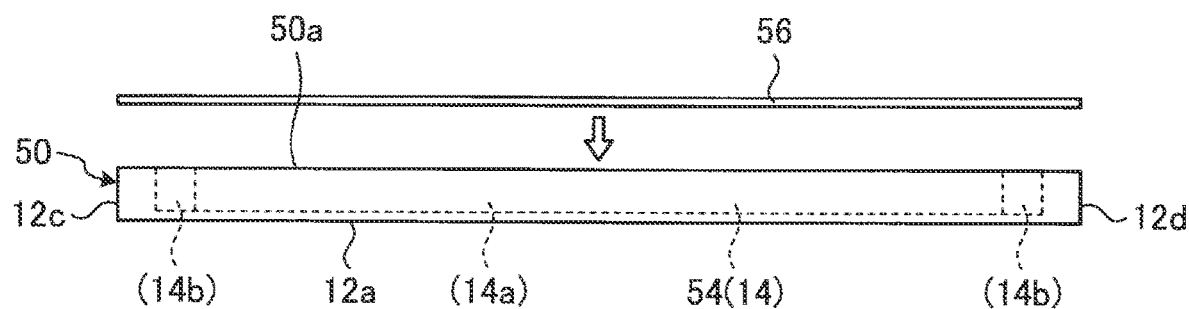
FIG. 12 is a top view of a state of joining a lid plate to a raw material plate in which a channel portion is formed by etching processing.

Subsequently, the raw material plate 50 provided with the mask 52 is subjected to predetermined etching processing. In the heat transport device 10 of the present disclosure, the metal plate 12 is formed of aluminum, for example. Then, the etching processing is carried out using a ferric chloride liquid, for example. Thus, a channel portion 54 opened to the surface 50a is formed in the raw material plate 50 as illustrated in FIG. 12. The channel portion 54 is a channel portion of a meandering shape having the same course of the course of the flow passage 14.

In Step S12, the surface 50a of the raw material plate 50 is closed with a lid plate 56 as illustrated in FIG. 12. The lid plate 56 is a thin plate containing the same material as that of the raw material plate 50, for example. The lid plate 56 is joined to the raw material plate 50 by diffused junction, for example. In the raw material plate 50, the channel portion 54 is closed by the junction of the lid plate 56 to the surface 50a. As a result, the channel portion 54 serves as the flow passage 14.

Step S13 and S14 are the same as Steps S4 and S5 in FIG. 6. More specifically, in Step S13, the raw material plate 50 in which the flow passage 14 is formed is molded with the pressing machine 42, so that the thin portion 18 is formed, whereby the metal plate 12 is formed. In Step S14, the hydraulic fluid F is charged into the flow passage 14 of the metal plate 12 formed in Step S13 to thereby complete the manufacturing of the heat transport device 10.

As described above, the plate-type heat transport device 10 according to the present disclosure has the flow passage 14 having the plurality of linear portions 14a extending in parallel to each other from the one end portion 12c of the metal plate 12 toward the other end portion 12d thereof and the return portions 1413 provided in each of the one end portion 12c and the other end portion 12d of the metal plate 12 and causing end portions of the linear portions 14a adjacent to each other to communicate with each other and configured so as to have a meandering shape inside the metal plate 12 and the hydraulic fluid F is enclosed in the flow passage 14. In the heat transport device 10, the metal plate 12 has the thin portion 18 in which the plate thickness of at least one part of a portion corresponding to the linear portions 14a is smaller than the plate thickness of a portion corresponding to the return portions 14b.

Therefore, in the heat transport device 10, the hydraulic fluid F enclosed in the flow passage 14 of a meandering shape causes latent heat transport by the vapor evaporated by heat absorption from the heating elements (CPU 35 and the like) serving as a cooling target and sensible heat transport by the vibration of the hydraulic fluid F of a liquid phase. Thus, the heat transport device 10 obtains high heat transport capability. Moreover, the heat transport device 10 has the thin portion 18 in which the plate thickness of the metal plate 12 is reduced in at least one part of the portion corresponding to the linear portions 14a of the flow passage 14. Thus, the heat transport device 10 can achieve the reduction in the plate thickness of the portion corresponding to the linear portions 14a hardly influenced by pressure loss while securing a sufficient flow passage cross-sectional area in the return portions 14b considerably influenced by pressure loss of the flow passage 14 of a meandering shape. As a result, the heat transport device 10 can reduce the plate thickness as much as possible while maintaining the high heat transport performance. Therefore, the heat transport device 10 can contribute to the thickness reduction of the chassis 30 of the electronic device 22 and the like in which the heat transport device 10 is to be mounted.

In the heat transport device 10, the metal plate 12 is configured so as to have a recessed shape as viewed in side view by configuring the one surface 12a side so as to have a flat plate shape and the other surface 12b side so that a portion provided with the thin portion 18 is recessed with respect to a portion corresponding to the return portions 14b. Thus, in the heat transport device 10, the CPU 35 and the like which are the heating elements can be efficiently disposed on the other surface 12b side of the recessed shape while the one surface 12a is disposed facing the one inner surface 30b of the chassis 30 of the electronic device 22 in which the heat transport device 10 is to be mounted, for example. As a result, the heat transport device 10 can be efficiently disposed in the chassis 30 of the electronic device 22 in which the heat transport device 10 is to be mounted and the like and can further contribute to a thickness reduction of the chassis 30.

The method for manufacturing the plate-type heat transport device 10 according to the present disclosure includes the first process (Steps S1 to S3 in FIG. 6, Steps S11 and S12 in FIG. 10) of forming the metal plate 12 having the flow passage 14 thereinside which is configured so as to have a meandering shape due to having a plurality of linear portions 14a extending in parallel to each other from the one end portion 12c toward the other end portion 12d and the return portions 14b provided in each of the one end portion 12c and the other end portion 12d and causing end portions of the linear portions 14a adjacent to each other to communicate with each other and in which the hydraulic fluid F is enclosed and the second process (Step S4 in FIG. 6, Step S13 in FIG. 10) of pressing at least one part of a portion corresponding to the linear portions 14a of the metal plate 12 formed in the first process in the plate thickness direction to form the thin portion 18. Therefore, according to the manufacturing method, the heat transport device 10 capable of achieving the high heat transport performance and the thickness reduction can be manufactured at a low cost and with simple facilities.

In this case, in the manufacturing method illustrated in FIG. 6, the raw material plate 20 in which the linear portions 14a are arranged in parallel to each other is formed by extrusion molding and the return portions 14b are formed in the one end portion 12c and the other end portion 12d of the raw material plate 20, and thereafter the one end portion 12c and the other end portion 12d are closed, whereby the metal plate 12 provided with the flow passage 14 thereinside is formed in the first process. Thus, the manufacturing method employs extrusion molding for the molding of the raw material plate 20, and therefore the heat transport device 10 can be manufactured at a low cost.

On the other hand, in the manufacturing method illustrated in FIG. 10, the metal plate 12 having the flow passage 14 is formed by forming the channel portion 54 having the same course as that of the flow passage 14 in the surface 50a of the raw material plate 50 by etching processing, and thereafter joining the lid plate 56 to the surface 50a of the raw material plate 50 to close the channel portion 54 in the first process. Thus, the manufacturing method employs etching processing for the molding of the raw material plate 50, and therefore the flow passage 14 (channel portion 54) can be finely processed with higher accuracy. As a result, the manufacturing method can achieve a further thickness reduction of the heat transport device 10 as compared with a manufacturing method employing extrusion molding which is machining. Moreover, the manufacturing method forms the flow passage 14 by etching processing, and therefore the shape degree of freedom of the flow passage 14 is improved, and thus the use of the heat transport device 10 to be manufactured can also expand. In this case, the manufacturing method illustrated in FIG. 10 can reduce the thickness of the heat transport device 10 as much as possible by etching processing, and therefore, even when the formation process (Step S13 in FIG. 10) of the thin portion 18 is omitted, a sufficient thickness reduction of the heat transport device 10 can be achieved.

As has been described, the present invention provides an improved electronic device having the plate-type heat transport device.

While the invention has been particularly shown and described with reference to a preferred embodiment, it will be understood by those skilled in the art that various changes in form and detail may be made therein without departing from the spirit and scope of the invention.

What is claimed is:

1. An electronic device comprising:
   a display;
   a plate-type heat transport device includes
      a metal plate having a first surface and a second surface, wherein said metal plate includes a meandering shape flow passage formed by a plurality of linear channels and return channels, wherein said linear channels extends in parallel to each other from a first end of said metal plate towards a second end of said metal plate, wherein said return channels are located at said first and second ends of said metal plate to allow said linear channels to communicate with each other, wherein a middle area of said metal plate associated with said linear channels is thinner than said first and second ends of said metal plate associated with said return channels, wherein said first surface covers said middle area of said metal plate, and said second surface covers said middle area and said first and second ends of said metal plate; and
      a hydraulic fluid contained within said flow passage of said metal plate; and
      a heating element attached to said middle area on said first surface of said metal plate;
      a heat dissipation fin attached to said first end of said metal plate;
      a fan attached to said middle area on said first surface of said metal plate, wherein said fan is adjacent to said heat dissipation fin;
      a chassis attached to said second surface of said metal plate such that said first surface of said metal plate is disposed facing one inner surface of said display.

2. The electronic device of claim 1, wherein said metal plate has an elongated U shape in a side view.

3. The electronic device of claim 1, wherein said heating element is attached to said first surface of said metal plate via a thermal rubber sheet.

4. The electronic device of claim 1, wherein said chassis has an elongated U-shape in a side view.

5. The electronic device of claim 4, wherein said display covers said U-shaped chassis.

6. The electronic device of claim 5, wherein said chassis includes an exhaust port located adjacent to said heat dissipation fin located on said first end of said metal plate.

7. The electronic device of claim 1, wherein said heating element is a CPU.

8. The electronic device of claim 1, wherein said heating element is a DC-DC converter.

9. The electronic device of claim 1, wherein said electronic device is a tablet-type computer.

10. The electronic device of claim 1, wherein said electronic device is a mobile phone.

* * * * *